US006379869B1

(12) United States Patent
Schroeder et al.

(10) Patent No.: US 6,379,869 B1
(45) Date of Patent: *Apr. 30, 2002

(54) METHOD OF IMPROVING THE ETCH RESISTANCE OF CHEMICALLY AMPLIFIED PHOTORESISTS BY INTRODUCING SILICON AFTER PATTERNING

(75) Inventors: Uwe Paul Schroeder, Poughkeepsie; Gerhard Kunkel, Fishkill; Alois Gutmann, Poughkeepsie; Bruno Spuler, Wappinger Falls, all of NY (US)

(73) Assignee: Infineon Technologies AG, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/282,745

(22) Filed: Mar. 31, 1999

(51) Int. Cl.[7] .................................................. G03F 7/00
(52) U.S. Cl. ........................ 430/313; 430/314; 430/328
(58) Field of Search .................................. 430/313, 330, 430/324, 315, 314, 325, 328

(56) References Cited

U.S. PATENT DOCUMENTS

| | | | | |
|---|---|---|---|---|
| 4,466,178 A | * | 8/1984 | Soclof | 29/576 |
| 5,039,593 A | * | 8/1991 | Zeigler | 430/313 |
| 5,229,254 A | * | 7/1993 | Lohaus et al. | 430/281 |
| 5,229,258 A | * | 7/1993 | Sezi et al. | 430/325 |
| 5,278,029 A | * | 1/1994 | Shirai et al. | 430/325 |
| 5,366,851 A | * | 11/1994 | Novembre | 430/322 |
| 5,707,783 A | * | 1/1998 | Stauffer et al. | 430/313 |
| 5,924,005 A | * | 7/1999 | Waldo | 438/623 |
| 6,017,680 A | | 1/2000 | Hattori et al. | 430/313 |
| 6,030,712 A | | 2/2000 | Nostu et al. | 428/480 |
| 6,045,978 A | * | 4/2000 | Tran et al. | 430/313 |
| 6,060,212 A | * | 5/2000 | McCulloch et al. | 430/270.1 |

FOREIGN PATENT DOCUMENTS

| | | |
|---|---|---|
| EP | 0195291 | 9/1986 |
| EP | 0274757 | 7/1988 |
| EP | 0364740 | 4/1990 |
| JP | 01137634 | 5/1989 |
| WO | WO9624887 | 8/1996 |

* cited by examiner

Primary Examiner—Kathleen Duda

(57) ABSTRACT

A photoresist system is provided that is easily structurable and is suitable for deep ultraviolet range patterning. An increased etching resistance to oxygen-containing plasma is produced in a lithographically generated photoresist structure by treatment with an etch protectant. The etch protectant includes a silylating agent for chemical reaction with reactive groups of the photoresist. In an embodiment, the photoresist includes a base resin initially containing no aromatic groups. Silylating agents include silicon tetrachloride, silicon tetrafluoride, trichlorosilane, dimethylchlorosilane and hexamethyldisilazane.

25 Claims, 1 Drawing Sheet

METHOD OF IMPROVING THE ETCH RESISTANCE OF CHEMICALLY AMPLIFIED PHOTORESISTS BY INTRODUCING SILICON AFTER PATTERNING

BACKGROUND OF THE INVENTION

1. Technical Field

This disclosure relates to photolithography in the field of integrated circuit manufacture, and more particularly to a method for improving the etch resistance of photoresists used in such photolithography.

2. Background of Related Art

Photolithography is a commonly used technique in the manufacture of integrated circuits for use in computers and other such applications. In photolithography a photoresist layer is formed on a substrate such as, for example, a silicon wafer. The photoresist is then covered with a mask containing a pattern, in transparent and opaque areas, which is intended to be etched onto the substrate. The mask is then exposed to actinic radiation, such as ultraviolet light (UV), X-ray, electron beam, and the like, which is transmitted through the transparent areas of the mask to cause a chemical reaction in corresponding regions of the photoresist. In a negative type photoresist the radiation impacted areas of the photoresist become insoluble in a developing solvent. For example, the radiation can initiate cross-linking, chain growth, photocondensation, or other such reaction to cause a chemical change in the photoresist. In a positive type photoresist the radiation impacted areas become more soluble in a developing solvent. For example, the radiation can cause photodegradation of the photoresist molecular structure. After radiation exposure the photoresist is developed by exposure to the developing solvent which washes away the soluble portions of the photoresist to leave a pattern. After this patterning step an etching process is conducted wherein the substrate is exposed to an acid, for example in a wet etch process, or an ion beam, for example in a dry etch process. The areas of the substrate covered by the remaining photoresist remain unetched. Finally, the remaining photoresist is removed by a suitable solvent or other conventional removal methods, leaving the substrate with a pattern etched therein.

In order to develop more powerful microprocessors, more electronic components must be put into the chip. Since the physical area of the chip is limited this means that the patterns etched into the substrate must become finer with higher resolution. At the present state of technology the patterns are of such fineness that the wavelengths of light used to expose the photoresist have become an important factor, the shorter wavelengths producing a higher resolution image.

Another factor is the thickness of the photoresist layer. The thinner the photoresist, the sharper the image. However, as the photoresist becomes thinner it becomes less able to withstand the etching process.

SUMMARY OF THE INVENTION

A method is provided herein for producing a photolithographic structure. The method includes (a) providing a photoresist having a base resin containing protected active sites which upon deprotection provide reactive sites and a photoactive component which is responsive to actinic radiation; (b) applying the photoresist to a substrate; (c) exposing selectively patterned areas of said photoresist to an effective dose of said electromagnetic radiation; (d) exposing said photoresist to a developing agent to create a patterned photoresist; then (e) deprotecting protected active sites of the base resin to provide reactive sites; then (f) reacting the reactive sites resulting from step (e) with an etch protectant containing a silylating agent to incorporate the etch protectant into the structure of the base resin; and, (g) etching the substrate.

The method described herein advantageously improves the etch resistance of the photoresist while maintaining the sensitivity of the photoresist to the patterning radiation.

BRIEF DESCRIPTION OF THE DRAWINGS

Various embodiments are described herein below with reference to the drawings wherein.

DETAILED DESCRIPTION OF PREFERRED EMBODIMENTS

Figure 1:
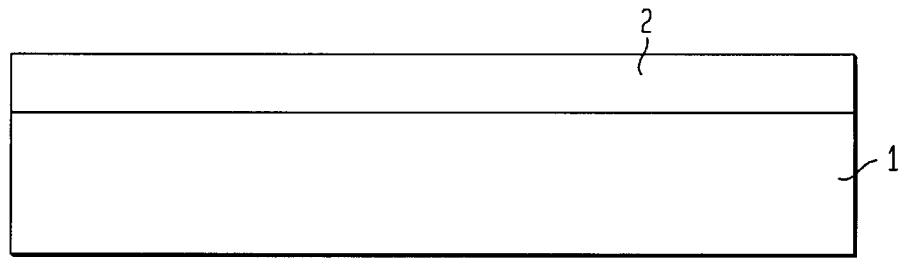
FIG. 1 illustrates a cross-sectional view of a structure after a step of a method in accordance with this disclosure.

The etch-resistant photoresist system described herein includes a photoresist that is well-structurable and responds to electromagnetic radiation having a wavelength below about 2500 Å. An etch protectant is employed to react with the photoresist after development to increase its etch resistance.

More particularly, the photoresist can be a positive or negative photoresist. The photoresist includes a base resin and a photoactive component (i.e., a photoacid generator) and is usually provided in the form of a solution of the base resin and photoactive component in a suitable solvent. Imagewise exposure of the photoresist to actinic radiation (e.g., UV radiation, X-rays, or electron beam radiation) through a mask releases acid from the photoacid generator in the exposed areas of the photoresist. With negative photoresists the exposed areas become less soluble in a developing solvent, for example by cross-linking of the polymer chains of the base resin. With positive photoresists the exposed areas become more soluble, for example by degradation or the formation of more soluble groups on the molecular chain. Aromatic groups tend to block transmission of UV radiation, especially at shorter wavelengths. Hence, for use with 2000 Å to 2500 Å UV radiation the base resin should have a reduced amount of aromatic groups ranging from 0% to about 20% by weight of aromatic content. For use with UV radiation having wavelengths of less than 2000 Å the base resin in the photoresist should contain substantially no aromatic groups.

The base resin includes active sites, or groups, which initially are protected by protecting groups which, in a later deprotecting step of the process herein, are removed. This process is catalyzed by the presence of photoacid and is generally used to provide higher base solubility of the exposed regions of the photoresist. The deprotection mechanism can also be used to generate reactive sites for further reaction. Useful reactive groups include hydroxyl (—OH), carboxyl (—COOH), mercapto (—SH), amino (—NH$_2$), alkylamino (—NHR), imino (—NH—), formyl (—CHO), sulfo (—SO$_3$H), an phosphono (—P(O) (OH)$_2$). Hydroxyl and carboxyl are preferred. The active sites can be protected with a suitable blocking agent having protecting groups. Suitable protecting groups include, e.g., benzyloxycarbonyl, trifluoroacetyl, benzyl ester, t-butyl ester, N-hydroxysuccinimide ester, and the like. A preferred blocking agent for the method described herein includes tert-butoxycarbonyl groups (t-BOC).

By way of example, the base resin for the positive or negative photoresist can be selected from polyhydroxystyrene, polymethylmethacrylate, poly(t-butyl) methacrylate, polyvinyl alcohol, polyvinylphenol, polynorbonene, poly(p-formyl)oxystyrene, poly(t-butoxycarbonyloxystyrene), polyvinylpyrrolidone, polymethylisoprenylketone, phenolformaldehyde polymers, melamine-formaldehyde polymers, and copolymers, blends and derivatives of these resins. Examples of commercially example positive photoresists include M20G available from JSR Co. of Japan and UV2HS available from Shipley Co. An example of a commercially available negative photoresist is UVN30 available from Shipley Co.

Photoactive components include photoacid generators such as, for example, diaryliodonium salts, triarylsulfonium salts, and substituted aryldiazonium salts, the salts having counterions such as tetrafluoborate, hexafluoroantimonate, hexafluoroarsenate and hexafluorophosphate. Other photoacid generators are halomethanes, trichlorotriazine, â-naphthol, nitrobenzaldehyde and polyvinylchloride. The photoresist may include additional substances used in conventional resist formulations. These additional substances may include, for example, additional polymers, sensitizers, crosslinking agents, speed enhancers, flexibility enhancers, adhesion enhancers, heat resistance enhancers, and surfactants. Such components are well known in the art. Examples of sensitizers are diazoquinones such as naphthoquinone-(1, 2)-diazide sulfonic acid esters, and particularly the 5-sulfonic acid ester of diazonaphthoquinone. Formulated photoresists and photoresist components are widely available from commercial suppliers.

The actinic radiation employed is preferably short wave ultraviolet light having a wavelength of about 2480 Å and more preferably far ultraviolet having a wavelength less than about 2000 Å (e.g., 1930 Å UV). Also useful are X-rays (having a wavelength below about 100 Å, and electron beam radiation.

The method of the present invention is performed according the following steps.

The photoresist is applied to a substrate such as silicon in a conventional manner. Usually, the photoresist solution is applied to a silicon wafer, which is then spun to distribute the photoresist in the form of an even layer over the wafer. The photoresist is then mildly heated to about 100° C. drive off the solvent. The preferred thickness of the photoresist layer is preferably no more than about 1 micron, preferably no more than about 0.8 microns, more preferably no more than about 0.5 microns, and most preferably no more than about 0.3 microns. FIG. 1 illustrates a photoresist layer 2 deposited on a silicon wafer substrate 1.

The photoresist is then patterned as follows. First, the photoresist is masked. The mask can contain lines and other features within a resolution of less than 1.0 micron, preferably less than 0.5 micron, and more preferably less than 0.3 micron. Then the photoresist is exposed to the electromagnetic radiation through the pattern of the mask at a sufficient dose level of radiation, typically from about 50 to about 200 mJ/cm$^2$. Next, the photoresist is patterned by exposure to a developing agent. An example of a suitable developing solution is an aqueous solution of developer AZ 400K (available from Hoechst AG) and ammonia. The photoresist is then dried under mild heating.

Figure 2:
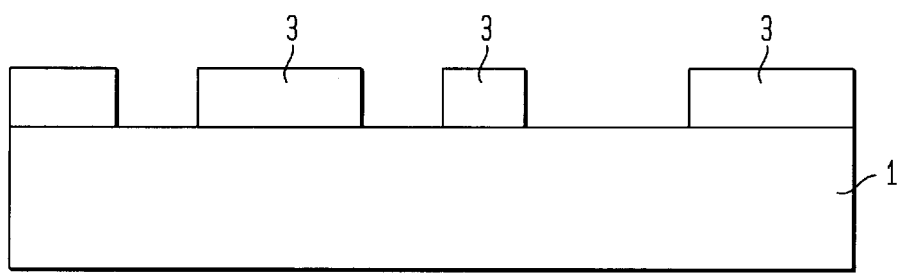
FIG. 2 illustrates a cross-sectional view of the structure after a further step of a method in accordance with this disclosure.

After development, the patterned photoresist is subjected to a deprotection step to expose the active sites of the base resin for reacting with the etch protectant. The deprotection is accomplished by flood exposure of the patterned photoresist to deep UV radiation (below 2500 Å) followed by a heat treatment, or baking step. The dosage of UV can be, for example, from about 20 mJ/cm$^2$ to about 50mJ/cm$^2$, although other dosages can also be used as deemed suitable. Under deep UV radiation, acid is generated from the photoacid component of the composition. The acid, in turn, deprotects the base resin during the heat treatment by exposing the active groups (e.g. hydroxyl, carboxyl, etc.). The exposed active groups thus become available for reaction with the etch protectant, and the latter, following reaction with the active groups, become chemically integrated into the polymeric structure of the base resin. The heat activation which achieves deprotection is conducted at a temperature of from about 100° C. to about 150° C. and for a duration of time ranging from about 1 minute to about 5 minutes. FIG. 2 illustrates the patterned photoresist at this stage of the process having patterned structures 3 on substrate 1.

Next the photoresist is treated with an etch protectant, which can be a reactive gas or in the form of a solution prepared by dissolving a reactive etch protectant in a suitable solvent such as hexanol. The etch protectant includes a silylating agent having one or more functional groups capable of reacting with the deprotected active groups of the base resin to bond the silylating agent to the base resin. Preferred silylating agents can be selected from the group consisting of silicon tetrachloride, silicon tetrafluoride, trimethylchlorosilane, trichlorosilane, dimethylchlorosilane, and hexamethyldisilazane. Other suitable silylating agents are disclosed in U.S. Pat. No. 5,707,783 which is herein incorporated by reference. The silylating agent provides increased etch resistance by contributing silicon to the photoresist structure.

Figure 3:
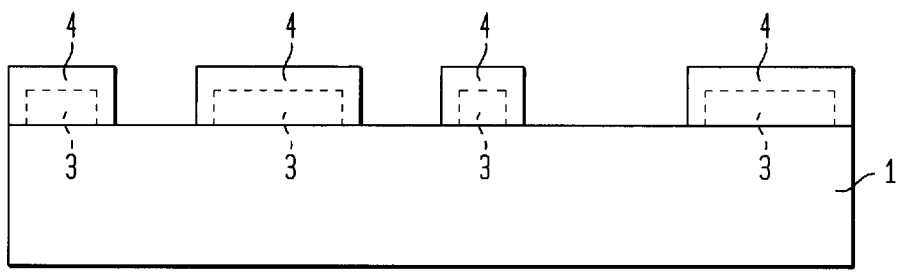
FIG. 3 illustrates a cross-sectional view of the structure after a further step of a method in accordance with this disclosure; and, FIG. 4 illustrates a cross-sectional view of the structure after a further step of a method in accordance with this disclosure.

Referring now to FIG. 3, the patterned photoresist structures 3 include chemically modified surface regions 4 in which silicon is incorporated. The surface regions 4 possess greater etch resistance than unmodified regions.

The photoresist and substrate are then subjected to a known etching process such as wet etching or, preferably, plasma etching. Wet etching is usually accomplished with acid etchants such as hydrofluoric acid. However, wet etching is not suitable for etching lines and spaces of less than about 3 microns because it is an isotropic process. That is, the etching also proceeds laterally through the substrate, thereby undercutting the photoresist. This may cause the polymer photoresist to swell or lift off.

Figure 4:
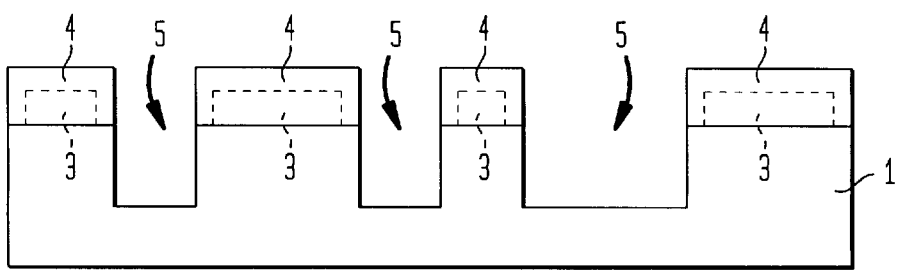

Plasma etching is preferred because it can be performed anisotropically, leaving sharper edge profiles. Plasma etching can be accomplished with oxygen-containing etch gas. FIG. 4 illustrates the substrate 1, having trenches 5 etched therein.

As noted above, plasma etching also can degrade the photoresist. However, silylated photoresists are more resistant to plasma etching. Silylation is particularly advantageous for imparting etch resistance to the photoresist wherein oxygen plasma is used. For example, photoresist silylated in accordance with the method described herein exhibit an etch rate in oxygen plasma of less than 45% of the etch rates of unsilylated photoresists. Hence, silylated photoresists can be formed into thinner layers, which also can produce sharper images.

Treatment with the reactant also causes a swelling of the resist structure. Swelling, due to the reactant treatment, can be an additional, positive benefit, in that it provides a controllable growth layer that creates an etching reserve due to the greater layer thickness. Thus, the resist can be structured in a thin layer with good resolution, and can be thickened with the reactant up to an adequate etch resistance. Also, the photomask can be set to a negative bias towards the target size of the printed structure. By deliberately overexposing the photoresist and adding silicon the final target size of the printed structure can be achieved. This procedure provides a greater flexibility in the process procedures.

The following Example is provided to illustrate the present invention.

EXAMPLE

A silicon wafer is coated with shipley UV2HS photoresist to a depth of 7380A. The coated wafer is then baked at 140° C. for 60 seconds to harden the resist. Selected areas of the photoresist are then exposed to 2480A UV radiation by means of a NIKON EXX 248 nm Excimer Laser Step & Scan exposure tool. The photoresist is then developed to remove the exposed areas of the photoresist. The wafer with imaged and developed photoresist is then treated by flood exposure of the photoresist to 2480A UV radiation at a dosage of 20 mJ/cm$^2$. Next the photoresist is treated with hexamethyldisilazane vapor at 100° C. for 60 seconds to silylate the photoresist. Then etching of the wafer by conventional means is performed for 30 seconds in an oxygen containing plasma (100 sscm Ar, 7 sscm $O_2$) to provide an etched silicon wafer.

It will be understood that various modifications can be made to the embodiments described herein. Therefore, the above description should not be construed as limiting, but merely as exemplifications of preferred embodiments. Those skilled in the art will envision other modifications within the scope of the claims appended hereto.

What is claimed is:

1. A method for producing a photolithographic structure, comprising the steps of:
   providing a photoresist having a base resin and a photoactive component which is responsive to actinic radiation;
   protecting active groups in the base resin by using protecting groups so that the base resin contains protected active groups which are nonreactive until being deprotected;
   applying the photoresist to a substrate;
   exposing selectively patterned areas of the photoresist to an effective dose of a first actinic radiation;
   developing the photoresist with a developing agent to create a patterned photoresist by removing soluble portions of the photoresist;
   exposing the patterned photoresist to a second actinic radiation;
   deprotecting the protected active groups by using the photoactive component responding to the second actinic radiation;
   reacting the active groups deprotected in the deprotecting step with an etch protectant containing a silylating agent to incorporate the etch protectant into the base resin of the patterned photoresist; and
   etching the substrate.

2. The method of claim 1 wherein the second actinic radiation is a UV radiation having a wavelength below about 2500 Å.

3. The method of claim 1 wherein the second actinic radiation is UV radiation having a wavelength below about 2000 Å.

4. The method of claim 1 wherein the base resin has an aromatic content of from about 0% to 20% by weight.

5. The method of claim 1 wherein the base resin includes substantially no aromatic groups.

6. The method of claim 1 wherein the photoresist is a positive photoresist.

7. The method of claim 1 wherein the photoresist is a negative photoresist.

8. The method of claim 1 wherein the photoresist includes a base resin selected from the group consisting of polyhydroxystyrene, polymethylmethacrylate, polyvinyl phenol, polyvinyl alcohol, polynorbonene, poly (p-formyl) oxystyrene, poly (t-butoxycarbonyloxystyrene), polyvinylpyrrolidone, plymethylisoprenylketone, phenol-formaldehyde, polymer, melamine-formaldehyde polymer and combinations thereof.

9. The method of claim 1 wherein the active groups are selected from the group consisting of hydroxyl, carboxyl, mercapto, amino, alkylamino, imino, formyl, sulfo and phosphono groups.

10. The method of claim 1 wherein the photoactive component of the photoresist is a photoacid generator selected from the group consisting of diaryliodonium salts, triarylsulfonium salts, substituted aryldiazonium salts, halomethanes, trichlorotriazine, â-naphthol, nitrobenzaldehyde, and polyvinylchloride.

11. The method of claim 1 wherein the step of exposing said patterned photoresist comprises subjecting the patterned photoresist to a heat treatment temperature of from about 100° C. to about 150° C.

12. The method of claim 11 wherein the plasma etching is accomplished with a oxygen-containing etch gas.

13. The method of claim 1 wherein said silylating agent comprises a compound selected from the group consisting of silicon tetrachloride, silicon tetrafluoride, trichlorosilane, dimethylchlorosilane and hexamethyldisilazane.

14. The method of claim 1 wherein said silylating agent is in the form of a gas.

15. The method of claim 1 wherein the step of etching the substrate comprises plasma etching.

16. The method of claim 1 wherein the step of deprotecting the protected active groups includes the steps of:
   generating acid from a photoacid generator contained in the photoactive component responding to the second actinic radiation; and
   removing the protecting groups by using the acid to release the active groups.

17. The method of claim 1, wherein the protecting groups include at least one of benzyloxycarbonyl, trifluoroacetyl, benzyl ester, t-butyl ester, and N-hydroxysuccinimide ester.

18. A method for producing a photolithographic structure, comprising the steps of:
   providing a photoresist including a base resin having an aromatic content of from about 0% to about 20% by weight and a photoactive component which is responsive to electromagnetic radiation having a wavelength of no more than about 2500 Å;
   protecting active groups in the base resin by using protecting groups so that the base resin contains protected active groups which are nonreactive until being deprotected;

applying the photoresist to a substrate;

exposing selectively patterned areas of the photoresist to an effective dose of a first electromagnetic radiation;

developing the photoresist with a developing agent to create a patterned photoresist by removing soluble portions of the photoresist;

exposing the patterned photoresist to a second electromagnetic radiation;

deprotecting the protected active groups by subjecting the photoactive component in the patterned photoresist to an effective dose of the second electromagnetic radiation and to a heat treatment at a temperature of from about 100° C. to about 150° C.;

reacting the active groups deprotected in the deprotecting step with an etch protectant containing a silylating agent to incorporate the etch protectant into the base resin of the patterned photoresist; and etching the substrate.

19. The method of claim 18 wherein the silylating agent is a compound selected from the group consisting of silicon tetrachloride, silicon tetrafluoride, trichlorosilane, dimethylchlorosilane and hexamethyldisilazane.

20. The method of claim 18 wherein the photoresist includes substantially no aromatic groups.

21. The method of claim 20 wherein the second electromagnetic radiation has a wavelength less than about 2000 Å.

22. The method of claim 1, wherein the step of reacting includes reacting the etch protectant with vertically disposed surfaces of the base resin.

23. The method of claim 18, wherein the step of reacting includes reacting the etch protectant with vertically disposed surfaces of the basin.

24. The method of claim 18, wherein the step of deprotecting the protected active groups includes the steps of:

generating acid from a photoacid generator contained in the photoactive component responding to the second electromagnetic radiation; and removing the protecting groups by using the acid to release the active groups.

25. The method of claim 18, wherein the protecting groups include at least one of benzyloxycarbonyl, trifluoroacetyl, benzyl ester, t-butyl ester, and N-hydroxysuccinimide ester.

* * * * *